US009507190B2

(12) United States Patent
Lun

(10) Patent No.: US 9,507,190 B2
(45) Date of Patent: Nov. 29, 2016

(54) DISPLAY PANEL AND METHOD FOR MANUFACTURING THE SAME, AND DISPLAY DEVICE

(71) Applicant: BOE TECHNOLOGY GROUP CO., LTD., Beijing (CN)

(72) Inventor: Jianchao Lun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/429,992

(22) PCT Filed: May 16, 2014

(86) PCT No.: PCT/CN2014/077661
§ 371 (c)(1),
(2) Date: Mar. 20, 2015

(87) PCT Pub. No.: WO2015/055004
PCT Pub. Date: Apr. 23, 2015

(65) Prior Publication Data
US 2015/0338691 A1    Nov. 26, 2015

(30) Foreign Application Priority Data
Oct. 18, 2013   (CN) .......................... 2013 1 0491955

(51) Int. Cl.
*G02F 1/133*     (2006.01)
*G02F 1/1343*    (2006.01)
(Continued)

(52) U.S. Cl.
CPC ......... *G02F 1/13306* (2013.01); *G02F 1/1368* (2013.01); *G02F 1/13439* (2013.01);
(Continued)

(58) Field of Classification Search
CPC .................. G02F 1/13306; G02F 1/133514; G02F 1/13439; G02F 1/1368; G02F 1/133345; G02F 21/13324; H01L 31/153
See application file for complete search history.

(56) References Cited

U.S. PATENT DOCUMENTS 8,294,858 B2 * 10/2012 Limketkai .............. G02B 5/201
                                                          136/244
8,618,825 B2 * 12/2013 Qin ..................... G01R 31/2884
                                                          257/59
(Continued)

FOREIGN PATENT DOCUMENTS

CN     101101930 A    1/2008
CN     101813849 A    8/2010
(Continued)

OTHER PUBLICATIONS

Machine translation of CN201984173 has been attached.*
(Continued)

*Primary Examiner* — Bilkis Jahan
(74) *Attorney, Agent, or Firm* — Nath, Goldberg & Meyer; Joshua B. Goldberg; Christopher Thomas

(57) ABSTRACT

The invention provides a display panel and a method for manufacturing the same, and a display device, belonging to the field of liquid crystal display technology, and can solve the problem existing in the prior art that amount of light absorbed by the solar cell in the display panel is limited. The display panel of the invention includes a light-transmissive region formed of sub-pixels, and at least one solar cell, and the solar cell is at least arranged at a part of the light-transmissive region of the display panel to supply power to the display panel; both a first electrode and a second electrode of the solar cell are made of a transparent conductive material, and at least light with the same color as the sub-pixels at the light-transmissive region can transmit the solar cell.

21 Claims, 2 Drawing Sheets

(51) Int. Cl.
- G02F 1/1368 (2006.01)
- G02F 1/1333 (2006.01)
- H01L 31/153 (2006.01)
- H01L 31/0352 (2006.01)
- G02F 1/1335 (2006.01)

(52) U.S. Cl.
CPC ... G02F1/133345 (2013.01); G02F 1/133514 (2013.01); H01L 31/035218 (2013.01); H01L 31/153 (2013.01); G02F 2001/13324 (2013.01); G02F 2202/106 (2013.01); G02F 2202/108 (2013.01)

(56) References Cited

U.S. PATENT DOCUMENTS

| | | | | |
|---|---|---|---|---|
| 2009/0185120 | A1* | 7/2009 | Yoon | G02F 1/13306 349/116 |
| 2010/0245731 | A1* | 9/2010 | Limketkai | G02B 5/201 349/106 |
| 2011/0155233 | A1* | 6/2011 | Liu | H01L 31/0352 136/256 |
| 2011/0163661 | A1* | 7/2011 | Lee | H01L 27/3227 313/504 |
| 2012/0241735 | A1* | 9/2012 | Honda | H01L 29/7869 257/43 |
| 2013/0074908 | A1* | 3/2013 | Suzuki | B82Y 10/00 136/249 |

FOREIGN PATENT DOCUMENTS

| | | | |
|---|---|---|---|
| CN | 101852947 A | 10/2010 | |
| CN | 201984173 | * 11/2010 | ............ H01L 51/46 |
| CN | 101995691 A | 3/2011 | |
| CN | 201984173 U | 9/2011 | |
| CN | 102540565 A | 7/2012 | |
| CN | 103529581 A | 1/2014 | |

OTHER PUBLICATIONS

International Search Report for International Application No. PCT/CN2014/077661.
First Office Action of CN Application No. 201310491955.7 issued Jul. 3, 2015, and its English Translation.
English translation of the Form PCT-ISA-237 in the international search report of PCT/CN2014/077661, mailed Jul. 28, 2014.

* cited by examiner

DISPLAY PANEL AND METHOD FOR MANUFACTURING THE SAME, AND DISPLAY DEVICE

This is a National Phase Application filed under 35 U.S.C. 371 as a national stage of PCT/CN2014/077661, filed May 16, 2014, an application claiming the benefit of Chinese Application No. 201310491955.7, filed Oct. 18, 2013, the content of each of which is hereby incorporated by reference in its entirety.

TECHNICAL FIELD

The present invention relates to the field of liquid crystal display technology, and particularly to a display panel and a method for manufacturing the same, and a display device.

BACKGROUND OF THE INVENTION

A liquid crystal display device has characteristics of low profile, low power consumption, digitization and the like, and is applied more and more widely in the market. Since the liquid crystals themselves do not emit light and cannot collect light from natural light, a stable and clear display must be obtained by using a backlight source. Generally, the electrical power of the backlight source is from an external cell such as a lithium cell, and it is not convenient for a user to charge the cell after its limited electrical storage is exhausted.

A solar cell is a device of using photovoltaic effect to convert solar energy into electrical energy. As shown in FIG. 1, in a conventional solar cell, when the N-type and P-type semiconductor materials contact, conductive particles diffuse and drift to form a built-in electric field with a direction from the N-type semiconductor material to the P-type semiconductor material at the interface of the two semiconductor materials. When light is incident onto the surface of the solar cell, photons provide energy to stimulate new electron-hole pairs in the semiconductor material. These stimulated electrons and holes apart from each other under the built-in electric field, and are rapidly accumulated at upper and lower electrodes of the solar cell, respectively. Based on this, the solar cell can supply power to a load connected to the two electrodes of the solar cell.

Since the solar power generation has advantages such as environmental protection, safety and the like, in a power consumption device such as a liquid crystal display device, the solar cell is used as efficiently as possible to collect light for producing energy, which will significantly facilitate saving of power consumption and environmental protection.

A conventional liquid crystal display device includes a driving circuit, an array substrate, a color filter substrate, a liquid crystal layer interposed between the array substrate and the color filter substrate, and a backlight source. When the liquid crystal display device operates normally, light emitted from the backlight source passes through the array substrate and irradiates onto the liquid crystal layer; and the driving circuit controls liquid crystal molecules in the liquid crystal layer to rotate by adjusting the distribution of the electric field between the array substrate and the color filter substrate, so that part or all of the light emitted from the backlight source transmits the liquid crystal layer and outgoes from the color filter substrate so as to achieve the display.

In a Chinese patent application with a publication number No. CN101813849A, a display device including solar cells is disclosed, and in the display device, the solar cells are located at the black matrixes of the color filter substrate, which is equivalent to replacing the black matrixes with the solar cells, to absorb the light emitted from the backlight source to convert light energy into electric energy for supplying power to the liquid crystal display device; in a Chinese patent application with a publication number No. CN101995691A, a display including solar cells is disclosed, and the solar cells are located at a non-light-transmissive part of the display to also absorb light emitted from the backlight source to convert light energy into electric energy for supplying power to the liquid crystal display device. These two patents only analyze the solar cells at the non-light-transmissive parts in the liquid crystal display device, and do not discuss the solar cells at light-transmissive part.

SUMMARY OF THE INVENTION

In view of the above problems existing in the display panel in the prior art, an object of the present invention is to provide a display panel with an increased power supply capability of a solar cell.

A technical solution to solve the technical problem of the present invention is a display panel, including a light-transmissive region formed of sub-pixels, and at least one solar cell, and the solar cell is at least arranged at a part of the light-transmissive region of the display panel to supply power to the display panel; both a first electrode and a second electrode of the solar cell are made of a transparent conductive material, and at least light with the same color as the sub-pixels at the light-transmissive region is able to transmit the solar cell.

In the display panel of the invention, the solar cell can allow light with the same color as the sub-pixels at the light-transmissive region to transmit, and meanwhile the solar cell can absorb a certain amount of light with colors different from that of the sub-pixels, so as to convert light energy into electric energy for supplying power to driving units (such as a gate driving unit, a source driving unit and the like) of the display panel, and further to save the power consumption of other power supply equipments. Moreover, relative to a light-blocking region of the display panel, the light-transmissive region of the display panel has a much larger area, and thus the amount of light irradiated onto the light-transmissive region is much larger than that irradiated onto the light-blocking region. Since in the invention, the solar cell is arranged at the light-transmissive region of the display panel, compared to the case in the prior art that the solar cell is arranged at the non-light-transmissive region (light-blocking region), the solar cell arranged at the light-transmissive region can absorb more light, obtain more electric energy from light energy, and store more electric energy therein.

Preferably, the solar cell further includes an active layer between the first electrode and the second electrode, and the active layer is made of CdSe quantum dots.

Further preferably, the display panel includes red sub-pixels, green sub-pixels, and blue sub-pixels, wherein the CdSe quantum dots in the solar cell at the light-transmissive region corresponding to the red sub-pixels have diameters in the range of 15 to 20 nm, the CdSe quantum dots in the solar cell at the light-transmissive region corresponding to the green sub-pixels have diameters in the range of 8 to 13 nm, and the CdSe quantum dots in the solar cell at the light-transmissive region corresponding to the blue sub-pixels have diameters in the range of 2 to 5 nm.

Preferably, the display panel further includes an array substrate, and the array substrate includes a first base substrate, an insulating layer and a thin film transistor, wherein the solar cell is arranged on the first base substrate, the insulating layer is arranged above the solar cell, and the thin film transistor is arranged above the insulating layer.

Preferably, the display panel further includes an array substrate, and the array substrate includes a first base substrate, an insulating layer and a thin film transistor, wherein the thin film transistor is arranged on the first base substrate, the insulating layer is arranged above the thin film transistor, and the solar cell is arranged above the insulating layer.

Preferably, the display panel further includes an array substrate, and the array substrate includes a first base substrate and a second base substrate, wherein a thin film transistor is arranged on an upper surface of the first base substrate, the solar cell is arranged on a lower surface of the second base substrate, and a lower surface of the first base substrate is attached to an upper surface of the second base substrate.

Preferably, the display panel further includes an array substrate, and the array substrate includes a first base substrate, wherein a thin film transistor is arranged on an upper surface of the first base substrate, and the solar cell is arranged on a lower surface of the first base substrate.

Preferably, the display panel further includes a color filter substrate, and the color filter substrate includes a third base substrate and a fourth base substrate, wherein a color filter layer is arranged on an upper surface of the third base substrate, the solar cell is arranged on a lower surface of the fourth base substrate, and a lower surface of the third base substrate is attached to an upper surface of the fourth base substrate.

Preferably, the display panel further includes a color filter substrate, and the color filter substrate includes a third base substrate, wherein the solar cell is arranged on an upper surface of the third base substrate, and a color filter layer is arranged on a lower surface of the third base substrate.

Preferably, the display panel further includes an array substrate and a color filter substrate, wherein both the light-transmissive region of the array substrate and the light-transmissive region of the color filter substrate are provided with solar cells.

Preferably, the solar cell is provided on a light-blocking region of the display panel.

Preferably, the display panel further includes a power supply module, and the first electrode and the second electrode of the solar cell are electrically connected to two electrodes of the power supply module, respectively.

The power supply module may include a gate driving circuit and/or a source driving circuit.

A technical solution employed to solve the technical problem of the invention is a method for manufacturing a display panel, including a step of: at least providing at least one solar cell at a part of a light-transmissive region formed of sub-pixels on the display panel to supply power to the display panel so that at least light with the same color as the sub-pixels at the light-transmissive region can transmit the solar cell.

Preferably, the step of at least providing at least one solar cell at a part of a light-transmissive region formed of sub-pixels on the display panel to supply power to the display panel includes: fabricating the solar cell on a first base substrate of an array substrate; forming an insulating layer on the first base substrate with the fabricated solar cell, and fabricating a thin film transistor on the first base substrate with the formed insulating layer.

Preferably, the step of at least providing at least one solar cell at a part of a light-transmissive region formed of sub-pixels on the display panel to supply power to the display panel includes: fabricating a thin film transistor on a first base substrate of an array substrate; forming an insulating layer on the first base substrate with the fabricated thin film transistor; and fabricating the solar cell on the first base substrate with the formed insulating layer.

Preferably, the step of at least providing at least one solar cell at a part of a light-transmissive region formed of sub-pixels on the display panel to supply power to the display panel includes: fabricating a thin film transistor on an upper surface of a first base substrate of an array substrate, and then fabricating the solar cell on a lower surface of the first base substrate; or fabricating the solar cell on a lower surface of a first base substrate of an array substrate, and then fabricating a thin film transistor on an upper surface of the first base substrate.

Preferably, the step of at least providing at least one solar cell at a part of a light-transmissive region formed of sub-pixels on the display panel to supply power to the display panel includes: fabricating a thin film transistor on an upper surface of a first base substrate of an array substrate, and then fabricating the solar cell on a lower surface of a second base substrate of the array substrate, or fabricating the solar cell on a lower surface of a second base substrate of an array substrate, and then fabricating a thin film transistor on an upper surface of a first base substrate of the array substrate; and attaching a lower surface of the first base substrate to an upper surface of the second base substrate.

Preferably, the step of at least providing at least one solar cell at a part of a light-transmissive region formed of sub-pixels on the display panel to supply power to the display panel includes: forming a color filter layer on an upper surface of a third base substrate of a color filter substrate, and then forming the solar cell on a lower surface of a fourth base substrate of the color filter substrate, or forming the solar cell on a lower surface of a fourth base substrate of a color filter substrate, and then forming a color filter layer on an upper surface of a third base substrate of the color filter substrate; and attaching a lower surface of the third base substrate to an upper surface of the fourth base substrate.

Preferably, the step of at least providing at least one solar cell at a part of a light-transmissive region formed of sub-pixels on the display panel to supply power to the display panel includes: forming a color filter layer on a lower surface of a third base substrate of a color filter substrate, and then forming the solar cell on an upper surface of the third base substrate, or forming the solar cell on an upper surface of a third base substrate of a color filter substrate, and then forming a color filter layer on a lower surface of the third base substrate.

Preferably, the step of fabricating the solar cell includes: forming a first electrode of the solar cell; forming an active layer above the first electrode; and forming a second electrode on the active layer.

A technical solution employed to solve the technical problem of the invention is a display device including the above display panel.

Since the display device of the invention includes the above display panel, power consumption of other power supply equipments may be decreased.

Preferably, the display device further includes a backlight source, and a power supply module for the backlight source, and a first electrode and a second electrode of the solar cell are electrically connected to two electrodes of the power supply module for the backlight source, respectively.

The invention further provides a method for manufacturing the above display panel, including: at least providing at least one solar cell at a part of a light-transmissive region on the display panel to supply power to the display panel so that at least light with the same color as the sub-pixels at the light-transmissive region can transmit the solar cell.

In the display panel and the display device including the display panel of the invention, the solar cell is at least provided at a part of the light-transmissive region of the display panel, and at least light with the same color as the sub-pixels at the light-transmissive region can transmit the solar cell, and light with other colors will be absorbed by the solar cell to be converted into electric energy, so that the solar cell will convert the absorbed light energy into electric energy to store for supplying power to the display panel without affecting normal operations of the sub-pixels on the display panel, and thus power consumption of the other power supply equipments such as a lithium cell could be decreased, and the frequency required to charging the lithium cell is reduced, bringing convenience to a user.

Figure 1:
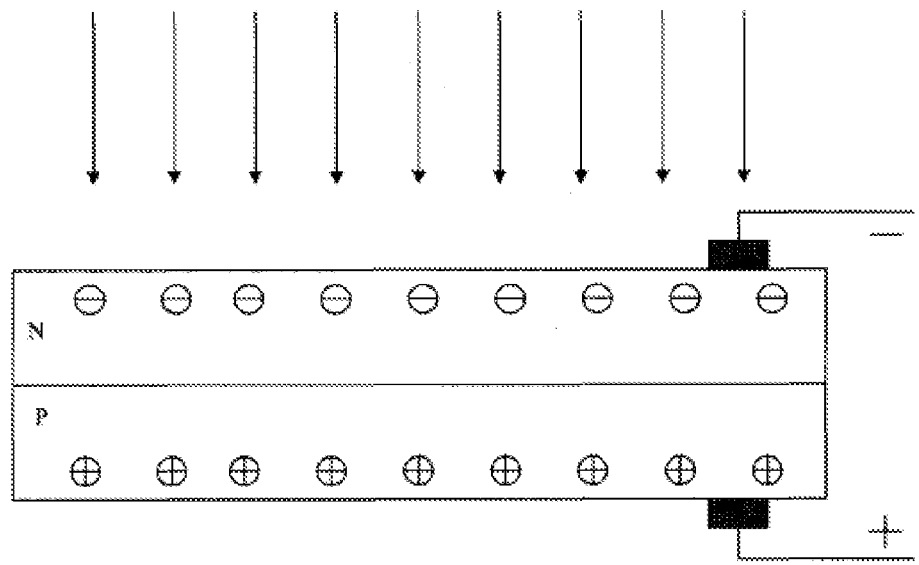
FIG. 1 is a schematic view of a structure of a solar cell in the prior art.

Reference signs: 101. first base substrate; 102. solar cell; 103. insulating layer; 104. thin film transistor; 201. second base substrate; 301. third base substrate; 302. fourth base substrate; 303. color filter layer.

DETAILED DESCRIPTION OF THE INVENTION

In order to make persons skilled in the art better understand the technical solutions of the invention, the invention will be described below in detail in conjunction with the drawings and embodiments.

As shown in FIGS. 2 to 6, the invention provides a display panel including a light-transmissive region formed of sub-pixels, solar cells 102 are at least arranged at a part of the light-transmissive region of the display panel to supply power to the display panel; wherein, both a first electrode and a second electrode of each of the solar cells 102 are made of a transparent conductive material, and at least light with the same color as the sub-pixels at the light-transmissive region can transmit the solar cell 102. One of the first electrode and the second electrode of the solar cell 102 is an anode, and the other is a cathode, and the light-transmissive region refers to any region on the display panel that light can transmit.

The solar cell 102 of the invention may allow light with the same color as the sub-pixels at the light-transmissive region to transmit, and the solar cell 102 can also absorb a certain amount of light with colors different from that of the sub-pixels, so as to convert light energy into electric energy for supplying power to driving units (such as a gate driving unit, a source driving unit and the like) of the display panel.

Moreover, the area of the light-transmissive region of the display panel is much larger than that of the light-blocking region of the display panel, and the amount of light irradiated onto the light-transmissive region is much larger than that irradiated onto the light-blocking region, since in the invention, the solar cells 102 are arranged at the light-transmissive region of the display panel, compared to the case in the prior art that the solar cells are arranged at the non-light-transmissive region (light-blocking region), the solar cells 102 arranged at the light-transmissive region in the invention can absorb more light, obtain more electric energy converted from light energy, and store more electric energy therein.

Preferably, the solar cell 102 includes a first electrode, a second electrode and an active layer between the first and second electrodes, and the active layer is made of CdSe quantum dots. It should be understood by persons skilled in the art that, the absorption and transmission characteristics of the quantum dots correspond to wavelengths of the light of various colors, and the absorption and transmission characteristics of the quantum dots are adjustable, and are associated with diameters of the quantum dots. Of course, the quantum dots in the solar cell 102 of the present invention are not limited to the kind of CdSe quantum dots, and may also include quantum dots of any other material.

Further preferably, the above display panel includes red sub-pixels, green sub-pixels, and blue sub-pixels, and the CdSe quantum dots in the solar cell 102 at the light-transmissive region corresponding to the red sub-pixels have diameters in the range of 15 to 20 nm, and in this case, the solar cell 102 may absorb light of other colors except for red light to convert it into electric energy, and the solar cell 102 can transmit only red light; the CdSe quantum dots in the solar cell 102 at the light-transmissive region corresponding to the green sub-pixels have diameters in the range of 8 to 13 nm, and in this case, the solar cell 102 may absorb light of other colors except for green light to convert it into electric energy, and the solar cell 102 can transmit only green light; and the CdSe quantum dots in the solar cell at the light-transmissive region corresponding to the blue sub-pixels have diameters in the range of 2 to 5 nm; and in this case, the solar cell 102 may absorb light of other colors except for blue light to convert it into electric energy, and the solar cell 102 can transmit only blue light. That is to say, the solar cell 102 of the invention can allow light with the same color as the sub-pixels at the light-transmissive region to transmit, and absorb light of other colors, thus the solar cell 102 will not affect light transmittance of the sub-pixels of various colors, and can also absorb light of unused colors (light with colors different from that of the sub-pixels at the light-transmissive region), to supply power to the power supply module and the like of the display panel, and it is not required to charge the lithium cell, bringing convenience to a user. Similarly, for the solar cell 102 including other quantum dots, diameters of the quantum dots at the light-transmissive region corresponding to various colors may be set according to the actual requirements so that light with the same color as the sub-pixels at the light-transmissive region can transmit.

Embodiment 1

Figure 2:
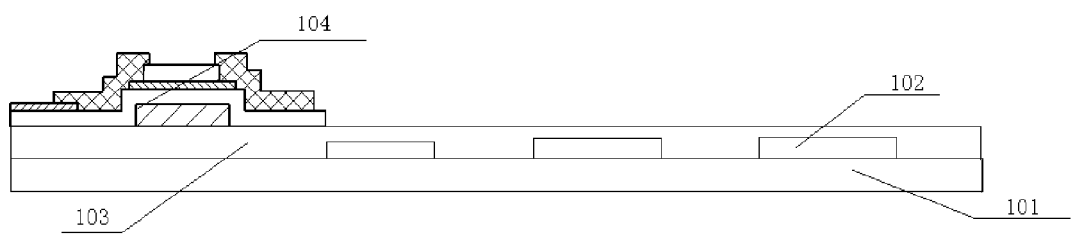
FIG. 2 is a schematic view of a display panel according to Embodiment 1 of the invention.

The display panel of the embodiment includes an array substrate. As Embodiment 1, as shown in FIG. 2, the array substrate includes a first base substrate 101, an insulating layer 103 and a thin film transistor 104, and solar cells 102 are provided on the first base substrate 101, the insulating layer 103 is provided above the solar cells 102, and the thin film transistor 104 is provided above the insulating layer 103.

The above is a case that the solar cells 102 are provided at a light-transmissive region of the array substrate, and in this case, when the array substrate is irradiated by light, the solar cells 102 can absorb a certain amount of light to convert light energy into electric energy for storing, and then supply power to energy consumpting components of the display panel.

Of course, the solar cells 102 may be also provided on a prepared array substrate. That is to say, the array substrate may include the first base substrate 101, components such as the thin film transistor 104 and the storage capacitor provided on the first base substrate 101, the insulating layer 103 formed on the components such as the thin film transistor 104 and the storage capacitor, and the solar cells 102 provided above the insulating layer 103.

Embodiment 2

Figure 3:
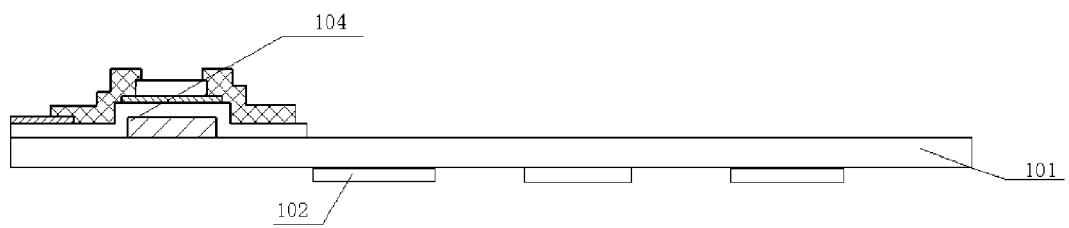
FIG. 3 is a schematic view of a display panel according to Embodiment 2 of the invention.

The display panel of the embodiment includes an array substrate. As Embodiment 2, as shown in FIG. 3, the array substrate includes a first base substrate 101, wherein a thin film transistor 104 is provided on an upper surface of the first base substrate 101, and solar cells 102 are provided on a lower surface of the first base substrate 101.

The above is another case that the solar cells 102 are provided at a light-transmissive region of the array substrate, and in this case, when the array substrate is irradiated by light, the solar cells 102 can absorb a certain amount of light to convert light energy into electric energy for storing, and then supply power to energy consumpting components of the display panel.

Embodiment 3

Figure 4:
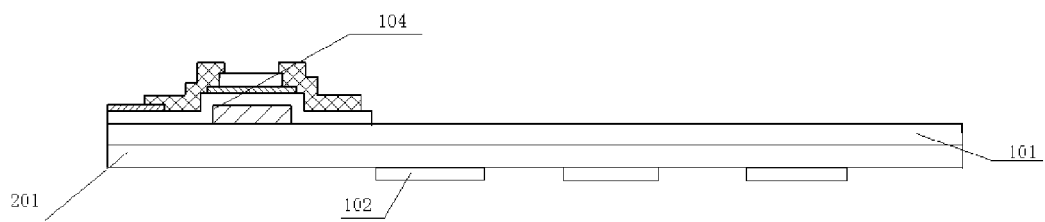
FIG. 4 is a schematic view of a display panel according to Embodiment 3 of the invention.

The display panel of the embodiment includes an array substrate. As Embodiment 3, as shown in FIG. 4, the array substrate includes a first base substrate 101 and a second base substrate 201, a thin film transistor 104 is provided on an upper surface of the first base substrate 101, solar cells 102 are provided on a lower surface of the second base substrate 201, wherein a lower surface of the first base substrate 101 is attached to an upper surface of the second base substrate 201.

The above is yet another case that the solar cells 102 are provided at a light-transmissive region of the array substrate, and in this case, when the array substrate is irradiated by light, the solar cells 102 can absorb a certain amount of light to convert light energy into electric energy for storing, and then supply power to energy consumpting components of the display panel.

Embodiment 4

Figure 5:
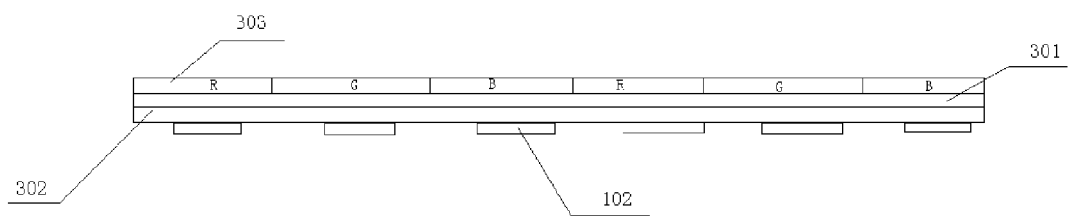
FIG. 5 is a schematic view of a display panel according to Embodiment 4 of the invention.

The display panel of the embodiment includes a color filter substrate. As Embodiment 4, as shown in FIG. 5, the color filter substrate includes a third base substrate 301 and a fourth base substrate 302, a color filter layer 303 is arranged on an upper surface of the third base substrate 301, solar cells 102 are arranged on a lower surface of the fourth base substrate 302, and a lower surface of the third base substrate 301 is attached to an upper surface of the fourth base substrate 302.

The above is a case that the solar cells 102 are provided at a light-transmissive region of the color filter substrate, and in this case, when the solar cells 102 are irradiated by light, the solar cells 102 can absorb a certain amount of light to convert light energy into electric energy for storing, and then supply power to energy consumpting components of the display panel.

Embodiment 5

Figure 6:
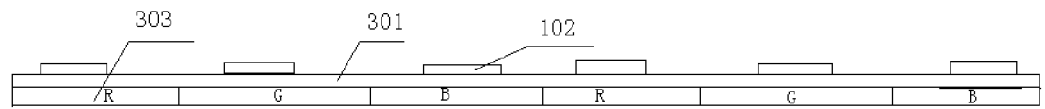
FIG. 6 is a schematic view of a display panel according to Embodiment 5 of the invention.

The display panel of the embodiment includes a color filter substrate. As Embodiment 5, as shown in FIG. 6, the color filter substrate includes a third base substrate 301, wherein solar cells 102 are arranged on an upper surface of the third base substrate 301, and a color filter layer 303 is arranged on a lower surface of the third base substrate 301.

The above is another case that the solar cell 102 is provided at a light-transmissive region of the color filter substrate, and in this case, when the color filter substrate is irradiated by light, the solar cells 102 can absorb a certain amount of light, in addition, can absorb light from external environment, to convert light energy into electric energy for storing, and then supply power to energy consumpting components of the display panel.

Preferably, the display panel of the invention further includes a power supply module, and the first electrode and the second electrode of each of the solar cells 102 are electrically connected to two electrodes of the power supply module, respectively. The power supply module may supply power to one or more of driving circuits such as a gate driving circuit and a source driving circuit of the display panel, and the solar cells 102 are all electrically connected to the power supply module, that is to say, the solar cells 102 can charge the power supply module.

It should be pointed out that, the upper surfaces and the lower surfaces of the first, second, third and fourth base substrates are relative, and are described relative to the directions shown in the Figures. Only the display panels with the above structures are described in the invention, and the invention is not limited to the above cases. For example, the invention may further include the following two cases: the display panel may include an array substrate and a color filter substrate, both the light-transmissive region of the array substrate and the light-transmissive region of the color filter substrate are provided with solar cells 102; and both the light-transmissive region and the light-blocking region of the display panel are provided with solar cells 102, wherein the light-blocking region is where non-light-transmissive components such as black matrixes of the color filter substrate, storage capacitors on the array substrate, and the thin film transistors 104 in the pixel region are located. According to the invention, any case that a light-transmissive region of the display panel is provided with the solar cell 102 should fall into the protection scope of the invention, and will not be described redundantly.

The invention further provides a method for manufacturing a display panel, including a step of: at least providing a solar cell 102 at a part of a light-transmissive region formed of sub-pixels on the display panel to supply power to the display panel so that at least light with the same color as the sub-pixels at the light-transmissive region may transmit the solar cell 102.

The embodiments of the method for manufacturing a display panel according to the invention will be described below in conjunction with the schematic views of the structures of the array substrates in Embodiments 1 to 5 shown in FIGS. 2 to 6.

The method for manufacturing the array substrate in Embodiment 1 of the invention as shown in FIG. 2 may include: first, fabricating solar cells 102 on a first base substrate 101, forming an insulating layer 103 on the first base substrate 101 with the fabricated solar cells 102, and fabricating other elements of the array substrate such as a thin film transistor 104 on the first base substrate 101 subjected to the preceding steps. The step of fabricating the solar cells 102 may specifically include: forming a first electrode of each of the solar cells 102 on the first base substrate 101, then forming an active layer (that is, PN junction) on the first electrodes by sputtering, evaporation, spin coating, or the like, and finally forming a second electrode of each of the solar cells 102 on the active layer. The first electrodes and the second electrodes may be made of Indium tin oxide (ITO), and may also be made of any other transparent conductive material.

The method for manufacturing the array substrate in Embodiment 2 of the invention as shown in FIG. 3 may include: first, fabricating elements such as a thin film transistor 104 and a storage capacitor on an upper surface of the first base substrate 101; and then fabricating solar cells 102 on a lower surface of the first base substrate 101. It should be pointed out that, the above two steps are interchangeable in order. The solar cells 102 are fabricated with the same method as for the above solar cells 102, and the detailed description will be omitted.

The method for manufacturing the array substrate in Embodiment 3 of the invention as shown in FIG. 4 may include: first, fabricating elements such as a thin film transistor 104 and a storage capacitor on an upper surface of a first base substrate 101; and then fabricating solar cells 102 on a lower surface of a second base substrate 201. It should be pointed out that, the above two steps are interchangeable in order. The solar cells 102 are fabricated with the same method as for the above solar cells 102, and the detailed description will be omitted. Finally, a lower surface of the resultant first base substrate 101 is attached to an upper surface of the second base substrate 201.

The method for manufacturing the array substrate in Embodiment 4 of the invention as shown in FIG. 5 may include: first, forming a color filter layer 303 on an upper surface of a third base substrate 301; and then fabricating solar cells 102 on a lower surface of a fourth base substrate 302. It should be pointed out that, the above two steps are interchangeable in order. The solar cells 102 are fabricated with the same method as for the above solar cells 102, and the detailed description will be omitted. Finally, a lower surface of the resultant third base substrate 301 is attached to an upper surface of the fourth base substrate 302.

The method for manufacturing the array substrate in Embodiment 5 of the invention as shown in FIG. 6 may include: first, fabricating a color filter layer 303 on a lower surface of a third base substrate 301; and then fabricating solar cells 102 on an upper surface of the third base substrate 301. It should be pointed out that, the above two steps are interchangeable in order. The solar cells 102 are fabricated with the same method as for the above solar cells 102, and the detailed description will be omitted.

The invention also provides a display device including the above display panel. The display device may be any product or component with display function, such as a mobile phone, a tablet computer, a TV, a monitor, a notebook computer, a digital photo frame, a navigator, etc.

The display device of the invention has the display panel in any of Embodiments 1 to 5. Thus, the solar cells provided at the light-transmissive region may be used to supply power to the display panel, and thus it is not required to charge the lithium cell, bringing convenience to the user.

Preferably, the display device of the invention further includes a backlight source and a power supply module for the backlight source, and the first and second electrodes of each of the solar cell 102 are electrically connected to two electrodes of the power supply module for the backlight source, respectively. The solar cells 102 are electrically connected to the power supply module for the backlight source, that is, the solar cells 102 charge the power supply module for the backlight source.

Of course, the display device of the invention may further include other conventional structures, such as a display driving unit.

It should be understood that, the forgoing embodiments are merely exemplary embodiments used for explaining the principle of the invention, but the present invention is not limited thereto. Various modifications and improvements may be made by those skilled in the art without departing from the spirit and essence of the present invention. These modifications and improvements shall fall within the protection scope of the present invention.

The invention claimed is:

1. A display panel, including a light-transmissive region formed of sub-pixels, and at least one solar cell, wherein
   the solar cell is at least arranged at a part of the light-transmissive region of the display panel to supply power to the display panel;
   both a first electrode and a second electrode of the solar cell are made of a transparent conductive material, and at least light with the same color as the sub-pixels at the light-transmissive region is able to transmit the solar cell; and
   an active layer is included between the first electrode and the second electrode, and the active layer is made of CdSe quantum dots;
   wherein the sub-pixels include red sub-pixels, green sub-pixels, and blue sub-pixels,
   wherein the CdSe quantum dots in the solar cell at the light-transmissive region corresponding to the red sub-pixels have diameters in the range of 15 to 20 nm, the CdSe quantum dots in the solar cell at the light-transmissive region corresponding to the green sub-pixels have diameters in the range of 8 to 13 nm, and the CdSe quantum dots in the solar cell at the light-transmissive region corresponding to the blue sub-pixels have diameters in the range of 2 to 5 nm.

2. The display panel of claim 1, further including an array substrate, wherein
   the array substrate includes a first base substrate, an insulating layer and a thin film transistor; and
   the solar cell is arranged on the first base substrate, the insulating layer is arranged above the solar cell, and the thin film transistor is arranged above the insulating layer.

3. The display panel of claim 1, further including an array substrate, wherein
   the array substrate includes a first base substrate, an insulating layer and a thin film transistor, and
   the thin film transistor is arranged on the first base substrate, the insulating layer is arranged above the thin film transistor, and the solar cell is arranged above the insulating layer.

4. The display panel of claim 1, further including an array substrate, wherein
   the array substrate includes a first base substrate, and
   a thin film transistor is arranged on an upper surface of the first base substrate, and the solar cell is on a lower surface of the first base substrate.

5. The display panel of claim 1, further including an array substrate, wherein
   the array substrate includes a first base substrate and a second base substrate, and
   a thin film transistor is arranged on an upper surface of the first base substrate, the solar cell is arranged on a lower surface of the second base substrate, and a lower surface of the first base substrate is attached to an upper surface of the second base substrate.

6. The display panel of claim 1, further including a color filter substrate, wherein
the color filter substrate includes a third base substrate and a fourth base substrate, and
a color filter layer is arranged on an upper surface of the third base substrate, the solar cell is arranged on a lower surface of the fourth base substrate, and a lower surface of the third base substrate is attached to an upper surface of the fourth base substrate.

7. The display panel of claim 1, further including a color filter substrate, wherein
the color filter substrate includes a third base substrate, and
the solar cell is arranged on an upper surface of the third base substrate, and a color filter layer is arranged on a lower surface of the third base substrate.

8. The display panel of claim 1, further including an array substrate and a color filter substrate, wherein
both the light-transmissive region of the array substrate and the light-transmissive region of the color filter substrate are provided with solar cells.

9. The display panel of claim 1, wherein the solar cell is provided on a light-blocking region of the display panel.

10. The display panel of claim 1, further including a power supply module, wherein
the first electrode and the second electrode of the solar cell are electrically connected to two electrodes of the power supply module, respectively.

11. The display panel of claim 10, wherein the power supply module includes a gate driving circuit and/or a source driving circuit.

12. A display device, including the display panel of claim 1.

13. The display panel of claim 12, further including a backlight source, and a power supply module for the backlight source, wherein
a first electrode and a second electrode of the solar cell are electrically connected to two electrodes of the power supply module for the backlight source, respectively.

14. A method for manufacturing a display panel, including a step of:
at least providing at least one solar cell at a part of a light-transmissive region formed of sub-pixels on the display panel to supply power to the display panel, so that at least light with the same color as the sub-pixels at the light-transmissive region is able to transmit the solar cell; and
providing an active layer between the first electrode and the second electrode, and the active layer is made of CdSe quantum dots;
wherein the sub-pixels include red sub-pixels, green sub-pixels, and blue sub-pixels,
wherein the CdSe quantum dots in the solar cell at the light-transmissive region corresponding to the red sub-pixels have diameters in the range of 15 to 20 nm, the CdSe quantum dots in the solar cell at the light-transmissive region corresponding to the green sub-pixels have diameters in the range of 8 to 13 nm, and the CdSe quantum dots in the solar cell at the light-transmissive region corresponding to the blue sub-pixels have diameters in the range of 2 to 5 nm.

15. The method of claim 14, wherein the step of at least providing at least one solar cell at a part of a light-transmissive region formed of sub-pixels on the display panel to supply power to the display panel includes:
fabricating the solar cell on a first base substrate of an array substrate;
forming an insulating layer on the first base substrate with the fabricated solar cell, and
fabricating a thin film transistor on the first base substrate with the formed insulating layer.

16. The method of claim 14, wherein the step of at least providing at least one solar cell at a part of a light-transmissive region formed of sub-pixels on the display panel to supply power to the display panel includes:
fabricating a thin film transistor on a first base substrate of an array substrate;
forming an insulating layer on the first base substrate with the fabricated thin film transistor; and
fabricating the solar cell on the first base substrate with the formed insulating layer.

17. The method of claim 14, wherein the step of at least providing at least one solar cell at a part of a light-transmissive region formed of sub-pixels on the display panel to supply power to the display panel includes:
fabricating a thin film transistor on an upper surface of a first base substrate of an array substrate, and then fabricating the solar cell on a lower surface of the first base substrate; or
fabricating the solar cell on a lower surface of a first base substrate of an array substrate, and then fabricating a thin film transistor on an upper surface of the first base substrate.

18. The method of claim 14, wherein the step of at least providing at least one solar cell at a part of a light-transmissive region formed of sub-pixels on the display panel to supply power to the display panel includes:
fabricating a thin film transistor on an upper surface of a first base substrate of an array substrate, and then fabricating the solar cell on a lower surface of a second base substrate of the array substrate, or fabricating the solar cell on a lower surface of a second base substrate of an array substrate, and then fabricating a thin film transistor on an upper surface of a first base substrate of the array substrate; and
attaching a lower surface of the first base substrate to an upper surface of the second base substrate.

19. The method of claim 14, wherein the step of at least providing at least one solar cell at a part of a light-transmissive region formed of sub-pixels on the display panel to supply power to the display panel includes:
forming a color filter layer on an upper surface of a third base substrate of a color filter substrate, and then forming the solar cell on a lower surface of a fourth base substrate of the color filter substrate, or forming the solar cell on a lower surface of a fourth base substrate of a color filter substrate, and then forming a color filter layer on an upper surface of a third base substrate of the color filter substrate; and
attaching a lower surface of the third base substrate to an upper surface of the fourth base substrate.

20. The method of claim 14, wherein the step of at least providing at least one solar cell at a part of a light-transmissive region formed of sub-pixels on the display panel to supply power to the display panel includes:
forming a color filter layer on a lower surface of a third base substrate of a color filter substrate, and then forming the solar cell on an upper surface of the third base substrate, or forming the solar cell on an upper surface of a third base substrate of a color filter substrate, and then forming a color filter layer on a lower surface of the third base substrate.

21. The method of claim 15, wherein the step of fabricating the solar cell includes:
forming a first electrode of the solar cell;
forming an active layer above the first electrode; and
forming a second electrode on the active layer.

* * * * *